United States Patent
Chen (10) Patent No.: US 6,937,507 B2
(45) Date of Patent: Aug. 30, 2005

(54) MEMORY DEVICE AND METHOD OF OPERATING SAME

(75) Inventor: Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 29 days.

(21) Appl. No.: 10/729,605

(22) Filed: Dec. 5, 2003

(65) Prior Publication Data

US 2005/0122771 A1 Jun. 9, 2005

(51) Int. Cl.⁷ .............................................. G11C 11/00
(52) U.S. Cl. .................. 365/163; 365/189.07; 365/210
(58) Field of Search ........................... 365/163, 189.07, 365/210; 257/3, 529

(56) References Cited

U.S. PATENT DOCUMENTS

| | | | |
|---|---|---|---|
| 4,203,123 A | 5/1980 | Shanks | |
| 6,314,014 B1 | 11/2001 | Lowrey et al. | |
| 6,480,438 B1 | 11/2002 | Park | |
| 6,487,113 B1 | 11/2002 | Park et al. | |
| 6,511,862 B2 | 1/2003 | Hudgens et al. | |
| 6,511,867 B2 | 1/2003 | Lowrey et al. | |
| 6,531,373 B2 | 3/2003 | Gill et al. | |
| 6,534,781 B2 | 3/2003 | Dennison | |
| 6,545,898 B1 * | 4/2003 | Scheuerlein | 365/94 |
| 6,545,907 B1 | 4/2003 | Lowrey et al. | |
| 6,563,164 B2 | 5/2003 | Lowrey et al. | |
| 6,566,700 B2 | 5/2003 | Xu | |
| 6,567,293 B1 | 5/2003 | Lowrey et al. | |
| 6,567,296 B1 | 5/2003 | Casagrande et al. | |
| 6,570,784 B2 | 5/2003 | Lowrey | |
| 6,768,665 B2 * | 7/2004 | Parkinson et al. | 365/113 |
| 6,791,102 B2 * | 9/2004 | Johnson et al. | 257/3 |

OTHER PUBLICATIONS

Hayashi, Fumihiko and Plummer, James D., "A Self--Aligned Split-Gate Flash EEPROM Cell With 3-D Pillar Structure", 1999 Symposium on VLSI Technology Digest of Technical Papers, Center for Integrated System, Stanford University, Stanford, CA 94305, USA, pp. 87–88.

* cited by examiner

Primary Examiner—Son T. Dinh
(74) Attorney, Agent, or Firm—DLA Piper Rudnick Gray Cary US LLP (57) ABSTRACT

An array of phase changing memory cells that includes a current source, a voltage sensor, a plurality of conductive bit lines electrically connected to the current source, a plurality of conductive word lines each electrically connected to a ground plane via a first resistor and to the voltage sensor, and a plurality of memory cells. Each memory cell is connected between one of the bit lines and one of the word lines and includes phase change memory material. One of the memory cells is selected by turning on switches just on the bit line and word line connected thereto, or by turning a switch connected in series between the corresponding bit and word lines, where the read current flows through the selected memory cell and the voltage sensor measures a voltage drop across the selected memory cell.

26 Claims, 8 Drawing Sheets

MEMORY DEVICE AND METHOD OF OPERATING SAME

FIELD OF THE INVENTION

The present invention relates to phase change memory devices, and more particularly to an array of phase change memory devices.

BACKGROUND OF THE INVENTION

There are many types of computer memory technologies that are presently used to store computer programs and data, including dynamic random access memory (DRAM), static random access memory (SRAM), erasable programmable read-only memory (EPROM), and electrically erasable programmable read only memory (EEPROM), etc. Some memory technologies require electrical power to maintain the stored data (i.e. volatile memory), while others do not (i.e. non-volatile memory). Memory technologies can be read only, write once only, or repeatedly read/write.

There is an increasing demand for repeatedly read/write, non-volatile memory. The primary non-volatile memory technology presently used is EEPROM, which utilizes floating gate field effect transistor devices each holding a charge on an insulated "floating gate". Each memory cell can be electrically programmed with one of two possible "bit values" (e.g. a "1" or a "0") by injecting or removing electrons onto or from the floating gate. However, EEPROM memory cells are getting more difficult to scale down to smaller sizes, are relatively slow to read and program, and can consume a relatively large amount of power.

Phase change memory devices have also been known for some time. These devices use memory materials that can be electrically switched (programmed) between different structured states that exhibit different electrical read-out properties. For example, memory devices made of a chalcogenide material are known, where the chalcogenide material is programmed between a generally amorphous state that exhibits a relatively high resistivity, and a generally crystalline state that exhibits a relatively low resistivity. The chalcogenide material is programmed by heating the material, whereby the amplitude and duration of the heating dictates whether the chalcogenide is left in an amorphous or crystallized state. The high and low resistivities represent programmed bit values of "1" and "0", which can be sensed by then measuring the resistivity of the chalcogenide material. Phase change memory devices have a high program speed (e.g. 200 ns), and exhibit great endurance and program retention.

Figure 1:
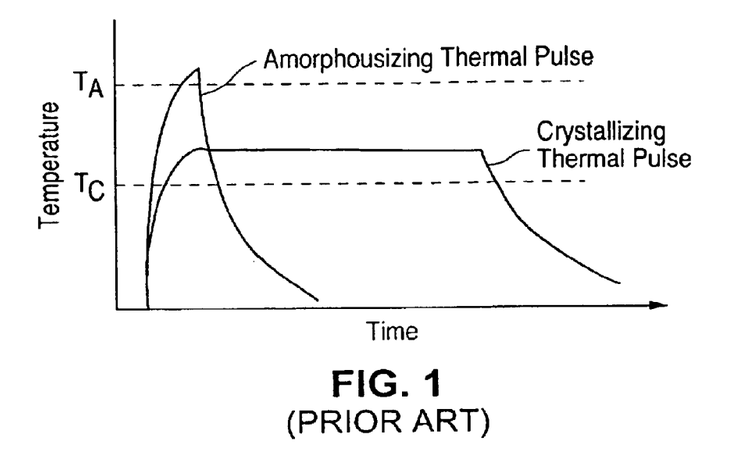
FIG. 1 is a graph illustrating amorphousizing and crystallizing phase change memory materials.

FIG. 1 is a graphical representation of how phase change material is programmed with either a relatively high or relatively low resistivity. To amorphousize the phase change material, a short and high amplitude thermal pulse (amorphousizing thermal pulse) is applied to the phase changing material so that it reaches a temperature beyond its amorphousizing temperature $T_A$. Once this temperature is reached, the volume of phase change material is rapidly cooled by removing the thermal pulse. So long as the phase change material is cooled faster than the rate at which it can crystallize, the phase change material is left in a relatively high-resistivity amorphous state. To crystallize the phase change material, a longer and lower amplitude thermal pulse (crystallizing thermal pulse) is applied to the phase change material so that it reaches a temperature beyond its crystallization temperature $T_C$, and is maintained above that temperature for a sufficient time to allow the phase change material to crystallize. After such time, the thermal pulse is removed, and the phase change material is left in a relatively low-resistivity crystallized state.

Figure 2A:
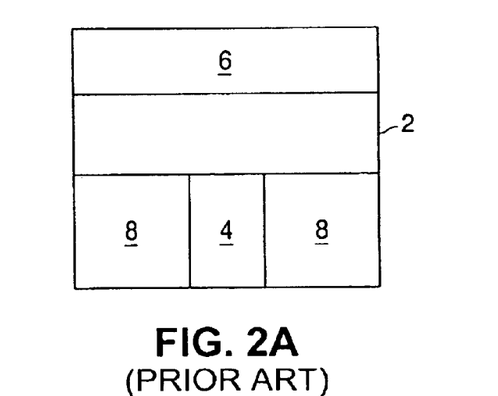
FIG. 2A is a cross-sectional view of a conventional phase change memory device.
Figure 2B:
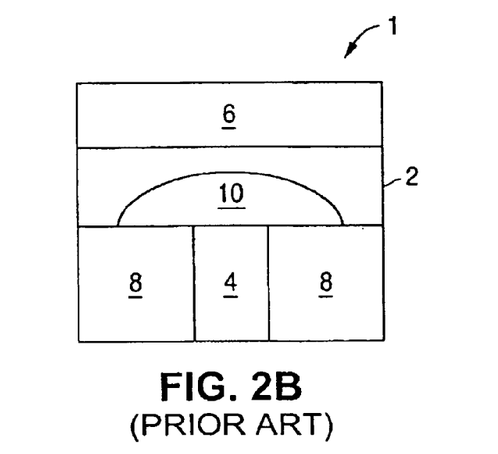
FIG. 2B is a cross-sectional view of the conventional phase change memory device, after undergoing a crystallizing thermal pulse.

FIG. 2A illustrates a memory cell 1 employing chalcogenide phase change memory material. The memory cell 1 includes a layer of chalcogenide 2 disposed between a pair of electrodes 4/6, and over thermal insulator material 8. One of the electrodes (in this case the lower electrode 4) has an increased resistivity making it a thermal heater that heats the chalcogenide layer 2 when an electrical current is passed through the electrodes 4/6 (and through the chalcogenide layer 2). FIG. 2A, for example, shows the chalcogenide 2 in its amorphous state in which the material is highly resistive. When heated by electrode 4 by a crystallizing thermal pulse, at least a portion 10 of the chalcogenide layer 2 is crystallized, as shown in FIG. 2B, which decreases the electrical resistance of the chalcogenide material. The chalcogenide 2 can be amorphousized back to its higher resistive state by applying an amorphousizing thermal pulse. The electrical resistance of memory cell 1 is read using a small electrical current that does not generate enough heat to reprogram the chalcogenide material.

It is even possible to program phase change memory material with varying degrees of amorphousization/crystallization to produce varying degrees of resistivity, so that more than two possible bit values can be stored in a single memory cell (multi-bit storage). For example, the longer the crystallizing thermal pulse, the more of the phase change material that is crystallized (i.e. the larger portion 10 becomes), and the lower the resistance of the memory material. By programming the memory material at various detectable degrees of amorphousization/crystallization, each with a different and detectable resistivity value (or range of values), multi-bit storage memory cells can be utilized.

Figure 3:
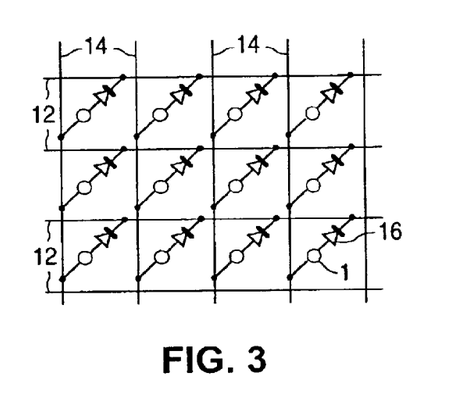
FIG. 3 is a schematic diagram showing a convention phase change memory cell array, with each memory cell having an associated isolation device.

It is known to arrange phase change memory material cells in an array configuration as schematically shown in FIG. 3, and as described in U.S. Pat. No. 6,567,296 which is incorporated herein by reference. The array includes conductive horizontal (word) address lines 12 and vertical (bit) address lines 14. Each memory cell is interconnected in series with an isolation device (i.e. PN diode) 16, and between one of the word lines 12 and one of the bit lines 14. The word and bit lines 12/14 are connected to components such as sense amplifiers, comparators, charge pumps, reference cells, pulse generators, etc. which are well known in the art and used for programming and reading the memory cells. Each memory cell 1 is associated with a unique combination of one of the word lines 12 and one of the bit lines 14. Thus, by bringing the word line and bit line associated with a selected memory cell to the writing or reading voltage(s), only that selected memory cell is programmed/read, because only the diode 16 associated with that memory cell is forward biased to allow current to pass there-through. All the remaining diodes 16 are reversed biased. During the read operation, the current flowing through the selected memory cell is compared with current flowing through a reference memory cell, to determine its programmed resistivity.

The disadvantages of this cell array configuration are that an isolation device needs to be formed for each memory cell. Further, because the memory device supplies a known voltage to the memory and reference cells, and then measures current therethrough, and any variation in resistance among the isolation devices will cause variations in the measured currents that are not attributable to the programmed resistivity of the memory cells themselves. Leakage current through the isolation devices can also be problematic.

SUMMARY OF THE INVENTION

The present invention is an array of phase change memory cells that includes a current source for supplying a read electrical current, a voltage sensor, a plurality of conductive bit lines each electrically connected to the current source via a first on/off switch, a plurality of conductive word lines each electrically connected to a voltage source via a second on/off switch and a first resistor, and to the voltage sensor, a plurality of memory cells, and a reference voltage source connected to the voltage sensor. Each of the memory cells includes a first electrode directly electrically connected to one of the bit lines, a second electrode directly electrically connected to one of the word lines, and phase change memory material disposed in electrical contact with the first and second electrodes.

The present invention is also an array of phase change memory cells that includes a current source for supplying a read electrical current, a voltage sensor, a plurality of conductive bit lines each electrically connected to the current source, a plurality of conductive word lines each electrically connected to a voltage source via a first resistor, and to the voltage sensor, a plurality of memory cells, and a reference voltage source connected to the voltage sensor. Each of the memory cells includes a first electrode directly electrically connected to one of the bit lines, a second electrode directly electrically connected to one of the word lines, phase change memory material disposed in electrical contact with the first and second electrodes, and a first on/off switch included in the direct electrical connection between the first electrode and the one bit line or the direct electrical connection between the second electrode and the one word line.

The present invention further includes a method of operating a memory cell array having a current source for supplying electrical current, a voltage sensor, a plurality of conductive bit lines each electrically connected to the current source via a first on/off switch, a plurality of conductive word lines each electrically connected to a voltage source via a second on/off switch and a first resistor and to the voltage sensor, a reference voltage source, and a plurality of memory cells, wherein each of the memory cells includes a first electrode directly electrically connected to one of the bit lines, a second electrode directly electrically connected to one of the word lines, and a phase change memory material disposed in electrical contact with the first and second electrodes. The method includes selecting one of the memory cells by turning on the first and second on/off switches for the bit and word lines directly electrically connected thereto, supplying a read electrical current from the current source to the bit line directly electrically connected to the selected memory cell, wherein the read electrical current flows through the selected memory cell and produces a first voltage on the word line directly electrically connected thereto, supplying a reference voltage from the reference voltage source, and measuring and comparing the first voltage and the reference voltage using the voltage sensor.

The present invention also includes a method of operating a memory cell array having a current source for supplying electrical current, a voltage sensor, a plurality of conductive bit lines each electrically connected to the current source, a plurality of conductive word lines each electrically connected to a voltage source via a first resistor and to the voltage sensor, a reference voltage source, and a plurality of memory cells, wherein each of the memory cells includes a first electrode directly electrically connected to one of the bit lines, a second electrode directly electrically connected to one of the word lines, a phase change memory material disposed in electrical contact with the first and second electrodes, and a first on/off switch included in the direct electrical connection between the first electrode and the one bit line or the direct electrical connection between the second electrode and the one word line. The method includes selecting one of the memory cells by turning on the first on/off switch for the selected memory cell, supplying a read electrical current from the current source to the bit line directly electrically connected to the selected memory cell, wherein the read electrical current flows through the selected memory cell and produces a first voltage on the word line directly electrically connected thereto, supplying a reference voltage from the reference voltage source, and measuring and comparing the first voltage and the reference voltage using the voltage sensor.

Other objects and features of the present invention will become apparent by a review of the specification, claims and appended figures.

DETAILED DESCRIPTION OF THE PREFERRED EMBODIMENTS

The present invention is an improved configuration and interconnection of an array of programmable memory material cells, as well as an improved method of programming and reading such cells.

Individual Memory Cells

Figure 4A:
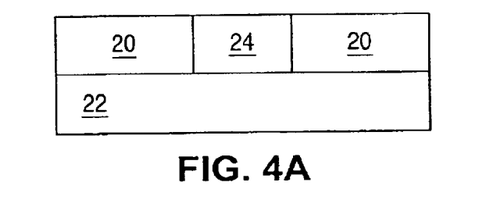
FIGS. 4A to 4C are cross-sectional views illustrating the process of forming a phase change memory cell.
Figure 4B:
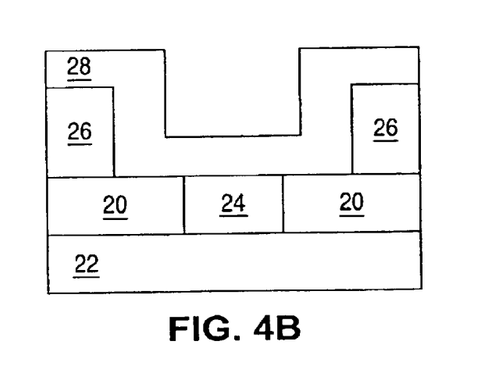
Figure 4C:
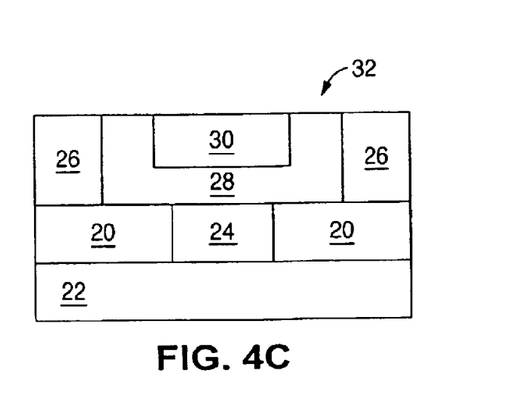

The individual memory cells used in the memory cell array of the present invention can be of many types that utilize phase change memory materials. FIGS. 4A to 4C illustrate a method of forming a phase change material memory cell used with the array of the present invention. The method begins by forming a layer 20 of insulation material (e.g. one or more layers of silicon dioxide—"oxide", silicon nitride—"nitride", ILD, etc.) over a silicon substrate 22 using a conventional deposition process. A (first) contact hole is formed in the insulation material 20 using a conventional lithographic etch process, which is then filled with a conductive material (e.g. tungsten, titanium-tungsten, etc.) by material deposition followed by a CMP (chemical-mechanical polishing) etch back process (using insulation material 20 as an etch stop), leaving a conductive lower electrode 24 in the contact hole, as shown in FIG. 4A. Another layer of insulation material 26 is formed over the structure, and a (second) contact hole is formed therein that extends down to and exposes lower electrode 24 and preferably some of first insulation layer 20 (i.e. second contact hole is preferably larger in diameter than the first contact hole). Memory material 28 of one or more layers of phase change material is then formed over the structure using a deposition process, as shown in FIG. 4B. The preferred phase change material is a chalcogenide alloy which includes at least one Group VI element (e.g. $Ge_2Sb_2Te_5$). Conductive material is then formed over the structure, followed by a CMP etch process (using insulation 26 as an etch stop), to remove the conductive material (and portions of memory material 28) disposed outside of second contact hole, leaving a conductive upper electrode 30 formed over the memory material 28. The resulting memory cell 32 is illustrated in FIG. 4C. Arrays of such memory cells can be simultaneously formed over the same substrate.

The resistivities of the lower electrode 24 and/or the upper electrode 30 is/are selected to generate the desired heating of the memory material 28 as electrical current is passed therebetween. This heating forms either the amorphousizing thermal pulse or crystallizing thermal pulse needed to amorphousize or crystallize the memory material. A low level electrical current is passed between the upper and lower electrodes 30/24 to measure the resistance, and thus the programming state, of the memory cell 32.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

Figure 5A:
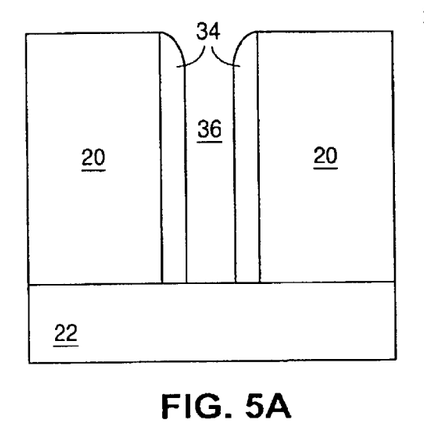
FIGS. 5A to 5C are cross-sectional views illustrating the process of forming a first alternate embodiment of the phase change memory cell of the present invention.
Figure 5B:
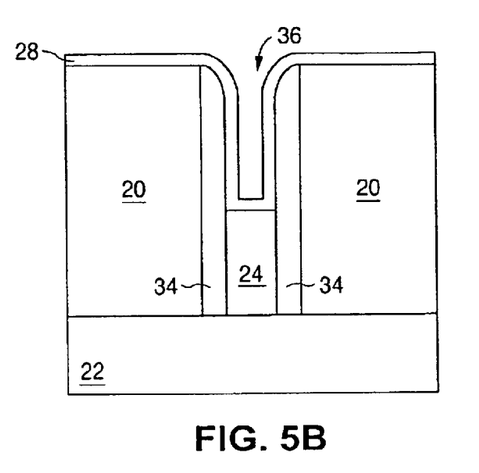
Figure 5C:
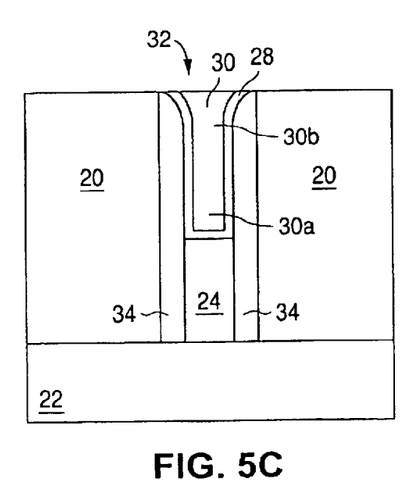

FIGS. 5A to 5C illustrate an alternate embodiment of the memory cell, and its formation, which focuses the generated heat to minimize the amount of memory material 28 that needs to be programmed. The method of forming the memory cell embodiment begins by forming insulation material 20 over substrate 22, and forming the (first) contact hole in the insulation material 20. Spacer material 34 is then formed in the contact hole. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. The upper surface of the spacer material curves downwardly in a generally rounded manner as it extends away from the structure against which it is formed. Thus, when spacer material is formed in a hole, opposing portions of the spacer material extend toward each other creating a central opening having a width or diameter that decreases with depth (i.e. funnel shaped). Spacer material 34 can be formed of any dielectric material, such as oxide, nitride, ILD, etc. In the present example, spacer material 34 is formed of nitride by depositing a layer of nitride over the entire structure followed by an anisotropic nitride etch process, such as the well known Reactive Ion Etch (RIE), to remove the deposited nitride except for spacer material 34 formed along the sidewalls of the contact opening, as shown in FIG. 5A. The spacer material defines an opening 36 having a width that narrows with depth, and is less than that defined by the lithographic process that originally formed the contact hole (e.g. by as much as 80% or more).

A thick layer of conductive material (e.g. tungsten, titanium-tungsten, etc.) is deposited over the structure, which fills the opening 36 in the contact hole with the conductive material. A CMP (chemical-mechanical polishing) etch follows using the top surface of the insulation material 20 as an etch stop, which removes the conductive material except for a block thereof inside the contact hole. A controlled etch process is then used to recess the top of this block below the top surface of the insulation material 20, where the recessed block of conductive material forms the lower electrode 24 of the memory cell, as illustrated in FIG. 5B. After the structure is cleaned to remove all etch residue, polymers, etc., a thin layer of the memory material 20 (which itself includes one or more layers of phase change material) is formed over the structure, including inside opening 36 (along spacer material 34 and on lower electrode 24), as shown in FIG. 5B.

Another thick layer of conductive material (e.g. tungsten, titanium-tungsten, etc.) is deposited over the structure, filling opening 36. A CMP etch follows using the top surface of the insulation material 20 as an etch stop, which removes those portions of the conductive material and memory material 28 that are disposed outside of the contact hole, and results in a block of the conductive material that forms the upper electrode 30 of the memory cell, as shown in FIG. 5C. The conductive material used to form upper electrode 30 is preferably selected and/or doped (e.g. by ion implant or by in-situ process) for increased resistivity, to enhance the heat generated thereby during operation, as explained in further detail below.

As shown in FIG. 5C, upper electrode 30 has a width that narrows as it extends down toward the lower electrode 24 (i.e. has a lower portion 30a that is narrower than an upper portion 30b). This narrowing of the electrode width is caused by the shape of the spacer material 34, against which the memory material 28 and upper electrode 30 are formed. The upper electrode 30 (and memory material 28 adjacent thereto) define a narrowing current path for the memory cell that reaches its smallest width at the portion thereof disposed directly above the lower electrode 24. To program the memory cell, a voltage is applied across the upper and lower electrodes 30/24 so that an electrical current pulse of predetermined amplitude and duration flows through upper electrode 30 to generate a thermal pulse which is concentrated in the lower portion 30a thereof where there is the greatest current density. The thermal pulse heats the lower portion of memory material 28 disposed between the narrowest portion of upper electrode 30 and lower electrode 24. The narrowing current path focuses much of the generated heat on that portion of the memory material 28 directly between the upper and lower electrodes 30/24. Surrounding the heating electrode 30 with spacer material 34 also increases the distance (and therefore thermal isolation) between heating electrodes and memory material from adjacent cells.

Figure 6:
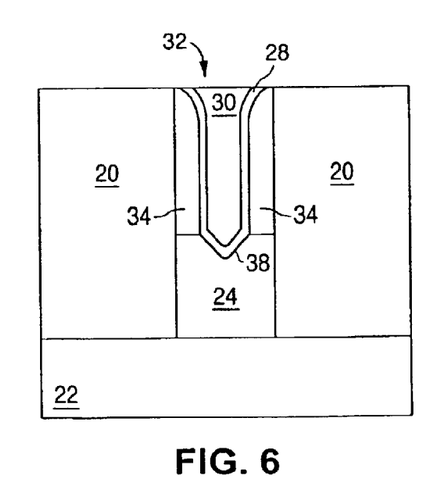
FIG. 6 is a cross-sectional view of a second alternate embodiment of the phase change memory cell of the present invention.

FIG. 6 illustrates a second alternate embodiment of the memory cell, where the lower electrode 24 is formed before the formation of the spacers 34. In this embodiment, the lower electrode width is not reduced by the spacers 34. This allows for the optional formation of an indentation 38 into the upper surface of the lower electrode 24 (e.g. by Ar sputtering on the portion of lower electrode 24 left exposed by the spacer material 34 before the formation of the memory material layer). This indentation 38 sharpens the tip of upper electrode lower portion 30a, and better focuses the heat generation at the memory material portion disposed directly in-between this tip and the lower electrode 24.

Figure 7:
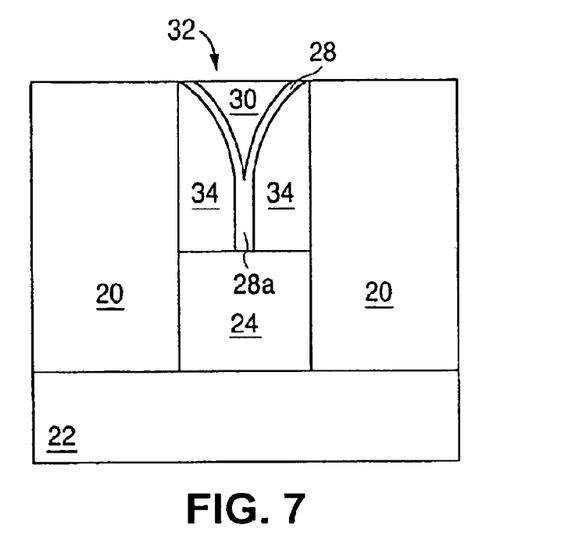
FIG. 7 is a cross-sectional view of a third alternate embodiment of the phase change memory cell of the present invention.

FIG. 7 illustrates a third alternate embodiment of the memory cell, where the thickness of the memory material 28 (compared to the area of the lower electrode 24 left exposed by the spacer material 34) is great enough so that the memory material layer merges to define a narrow column 28a of the memory material directly over the lower electrode 24. The upper electrode 30 and memory material layer 28 define a narrowing current path that reaches a minimum width at the memory material column 28a. With this embodiment, the greatest current density in the memory cell is found inside the memory material column 28a. Thus, the chalcogenide material that forms column 28a heats itself as well as current passes through the memory cell. In fact, during an amorphousizing thermal pulse, as the chalcogenide heats up and pockets of the chalcogenide material become amorphous, the resistivity of column 28a rises, causing even more heat dissipation within the column material.

Array Configuration and Interconnection

Figure 8:
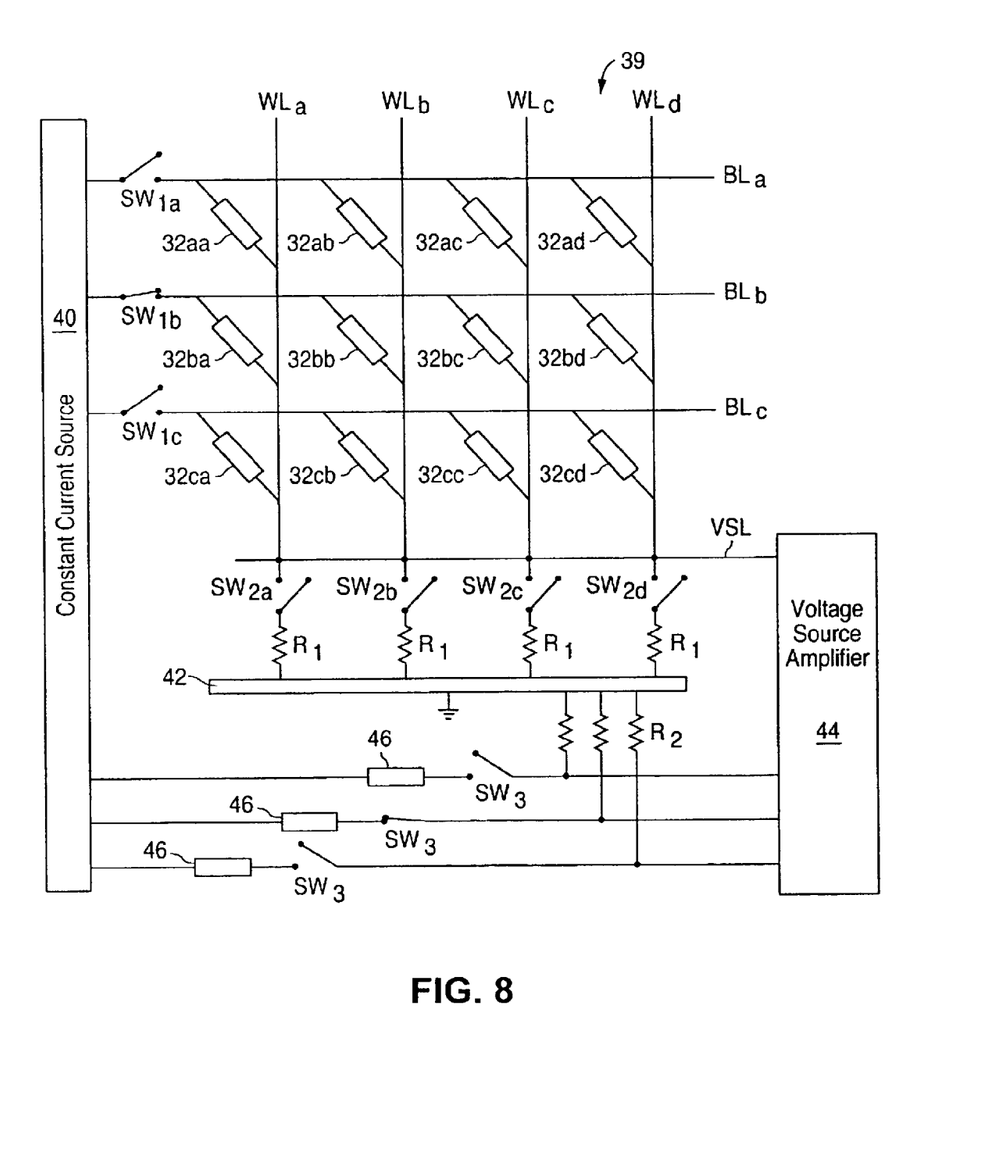
FIG. 8 is a schematic diagram illustrating the phase change memory cell array of the present invention.

FIG. 8 illustrates the memory cell array 39 of the present invention. Although the array of FIG. 8 only shows 12 memory cells 32, it should be clear that much larger arrays having the configuration and interconnections of the present invention can be formed. The memory cell array 39 includes a plurality of conductive bit lines BL extending in the row direction of the array and a plurality of conductive word lines WL extending in the column direction of the array. Each of the bit lines BL is connected to a constant current source 40 via an on/off switch $SW_1$. Each of the word lines WL is connected to a voltage source 42 (e.g. a common ground plane) via an on/off switch $SW_2$ and a resistor $R_1$. Each word line WL is also electrically connected to a voltage sense line VSL, which in turn is connected to a voltage sense amplifier 44 for measuring the voltage of the word lines WL. For each unique combination of word lines WL and bit lines BL, a programmable phase change material memory cell 32 is connected therebetween (i.e. the upper electrodes 30 are each directly electrically connected to one of the bit lines BL, and the lower electrodes 24 are each directly electrically connected to one of the word lines WL). The array also includes a plurality of reference phase change memory cells 46, which are preferably formed using the same processing steps used to form memory cells 32, but have known programmed states and are each directly electrically connectable between the current source 40 and the voltage sense amplifier 44 via an on/off switch $SW_3$, and connected to the voltage source 42 via a resistor $R_2$.

Switches $SW_1$, $SW_2$ and $SW_3$ can be any appropriate semiconductor on/off switch (e.g. field effect transistors, etc.) that are highly conductive (i.e. create a direct electrical connection) when on and highly resistive when off, and are used to select a single memory cell 32 to program and/or read, and which reference cell is connected to the voltage sense amplifier 44. For example, in FIG. 8, $SW_{1b}$ and $SW_{2b}$ are closed (on), with the remaining switches $SW_1$ and $SW_2$ open (off), thus selecting memory cell $32_{bb}$ as the only memory cell directly electrically connected between current source 40 and voltage sense amplifier 44, and electrically connected to ground 42 via resistor $R_1$. For the purposes of this disclosure, a direct electrical connection between two components is one where there is a direct, low resistance, highly conductive electrical current path therebetween (e.g. conductive lines, closed switches, etc.), with no intermediary electrical components (e.g. diodes, capacitors, resistors, etc.) disposed in the electrical path.

To program a selected memory cell in the array 39 (e.g. memory cell $32_{bb}$), the appropriate switches (e.g. $SW_{1b}$ and $SW_{2b}$) are closed (on) so that an electrical path is created between the current source 40 and voltage source 42 (e.g. ground plane) that runs through the selected cell. The current source 40 provides a programming electrical current (electrical pulse) of sufficient duration and amplitude through the selected memory cell to program it with the desired resistivity (i.e. generate a thermal pulse therein for the desired amount of amorphousization or crystallization of the memory material). The memory cells can be programmed between two states (generally crystallized or generally amorphousized) exhibiting generally two different resistivity values, or even programmed with one of a plurality of different degrees of crystallization or amorphousization that exhibit a plurality of different resistivity values. It should be noted that more than one memory cell can be programmed simultaneously by closing additional switches ($SW_1$ and $SW_2$) and increasing the current from the current source 40 (if necessary).

To read a selected memory cell in the array 39 (e.g. memory cell $32_{bb}$), only the appropriate switches are closed (e.g. $SW_{1b}$ and $SW_{2b}$) so that an electrical path is created between the current source 40 and ground plane 42 that runs only through the selected memory cell. The remaining switches are off. The current source 40 provides a read electrical current (that is less than the programming current and insufficient for programming the memory material) through the selected memory cell and the resistor $R_1$ associated with the selected cell's word line. The electrical current through the selected memory cell causes a voltage drop across it that is proportional to its resistance. Thus, the selected memory cell provides an output voltage on the one word line (and thus on voltage sense line VSL), which is measured by the voltage sense amplifier 44, and which is proportional to the selected memory cell's programmed resistance. The current source 40 also provides the same predetermined electrical current through at least one of the reference memory cells 46, causing a voltage drop across it that is also proportional to its (known) resistance. Thus, each of the reference memory cells provides a reference voltage that is proportional to its known programmed state and is also measured by the voltage sense amplifier (when the appropriate switch $SW_3$ is turned on). By comparing the measured memory cell output voltage on the voltage sense line VSL to the reference memory cell voltage(s), the programming state (i.e. programmed resistivity) of the selected memory cell 32 can be reliably determined. While voltage sense amplifier 44 is preferably both a voltage sensor and a voltage comparator, this voltage comparison can be performed by an external component of the voltage sense amplifier 44 as well.

The array is more reliable than prior art array designs because each memory cell is directly electrically connected to both the current source 40 and the voltage sense amplifier 44 when the appropriate switches are closed, with no intervening electrical components therebetween. The configuration and interconnections of the array 39 avoid the need to form electrical components for each memory cell (e.g. isolation diodes) that add complexity to the array, that can vary in performance from cell to cell, and that result in leakage current. By supplying the same electrical current from the same current source to both the selected memory cell 32 and the reference memory cell(s) 46, and then measuring and comparing voltage drops across them using the same voltage sense amplifier 44, the programming state of the selected memory cell 32 can be accurately determined, without any adverse and/or varying affects from any intermediary electrical components. Additionally, using reference memory cells 46 made by the same fabrication processing steps as the memory cells 32 compensates for any manufacturing deviations that can occur from device to device. Lastly, unlike diodes, the switches $SW_1$, $SW_2$, and $SW_3$ do not exhibit excessive leakage currents that could reduce the accuracy of the program and read operations.

Figure 9:
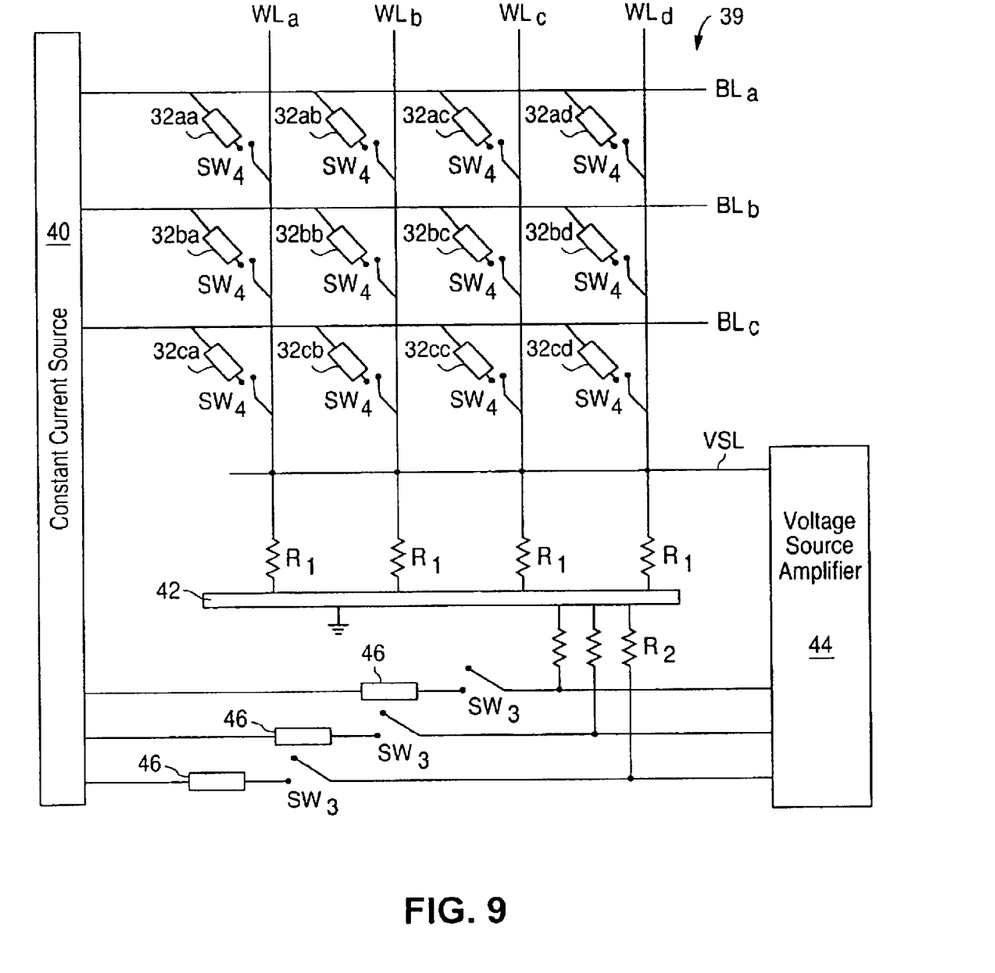
FIG. 9 is a schematic diagram illustrating an alternate embodiment of the phase change memory cell array of the present invention.

FIG. 9 illustrates an alternate embodiment of the memory cell array of the present invention. In this embodiment, bit line switches $SW_1$ and word line switches $SW_2$ are omitted, and replaced with memory cell on/off switches $SW_4$ each of which is placed in series between one of the memory cells 32 and its respective word line WL (as shown in FIG. 9) or its respective bit line BL. While this embodiment is more complex, each memory cell can be independently operated without implicating entire rows or columns of the memory cells, by only turning on the on/off switch $SW_4$ for the memory cell being read.

Figure 10A:
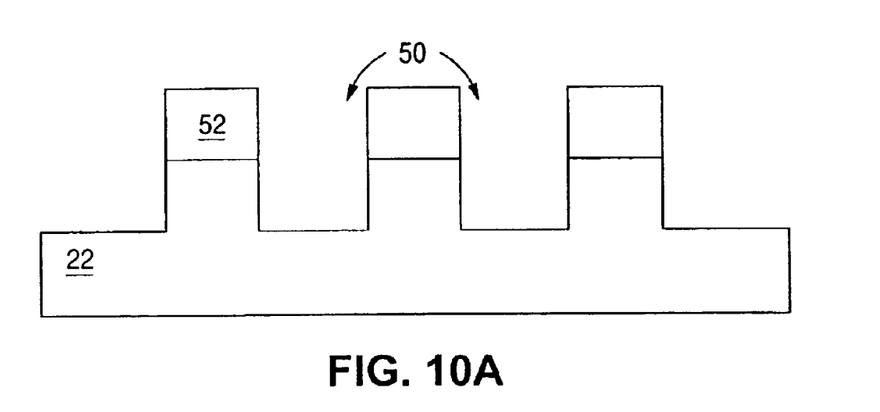
FIGS. 10A to 10D are cross-sectional views illustrating the process of forming memory cells of the alternate embodiment of the phase change memory cell array of the present invention.
Figure 10B:
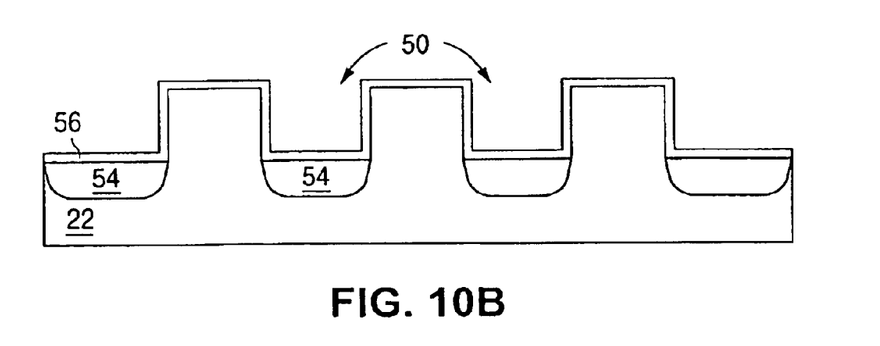

FIGS. 10A to 10D illustrate a method of forming switches $SW_4$ underneath the memory cells 32 to reduce the overall size of the array 39. The process begins by forming elongated trenches 50 in a substrate using a well known lithographic technique (e.g. form strips of photo resist 52 over silicon substrate 22, followed by a silicon anisotropic etch to remove the exposed portion of substrate 22), as shown in FIG. 10A. Suitable ion implantation (and possible anneal) is then made across the surface of the structure to form conductive first (source) regions 54 in the exposed substrate portions at the bottoms of trenches 50. After the photo resist 52 is removed, a thermal oxidation process is then performed to form a layer of oxide 56 over the structure, as shown in FIG. 10B.

Figure 10C:
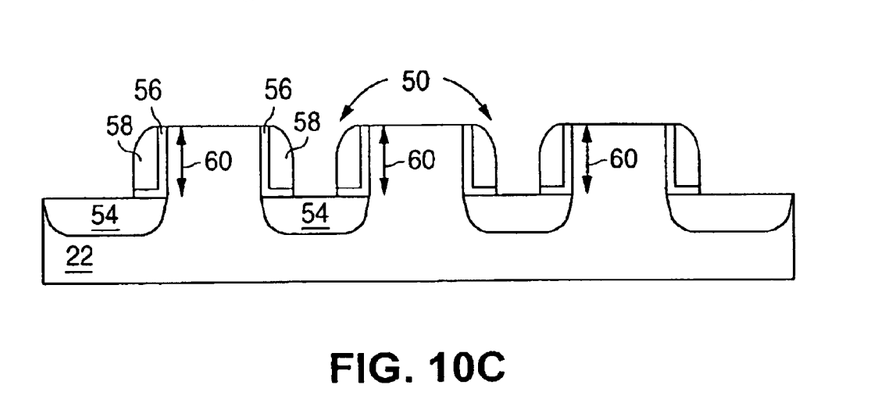

Polysilicon (poly) spacers 58 are next formed along the sidewalls of trenches 50 by a poly deposition and etch process. An oxide etch follows with removes the exposed portions of oxide layer 56 (i.e. those portions not protected by poly spacers 58), resulting in the structure shown in FIG. 10C. As shown in this figure, channel regions 60 of the substrate extend from the source regions 54 and along the substrate portions adjacent the poly spacers 58.

Figure 10D:
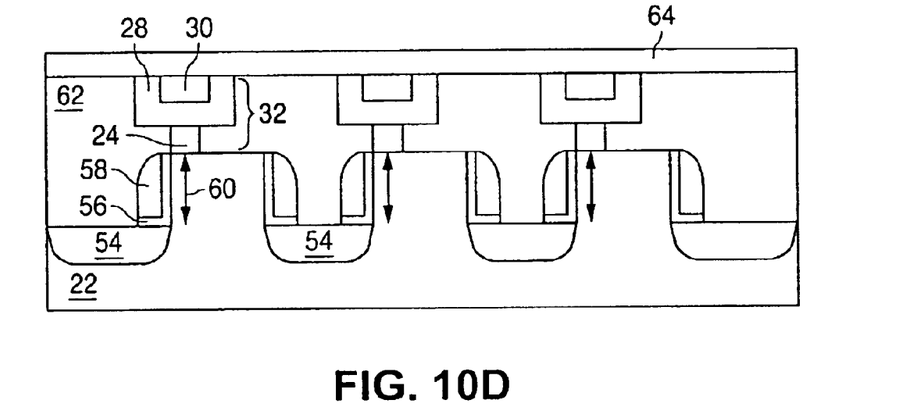

A thick layer of insulation 62 (e.g. ILD) is deposited over the structure and planarized (e.g. by CMP planarization etch). Phase change memory cells 32 are then formed over the structure, with one of the electrodes for each cell in electrical contact with one of the channel regions 60 of the substrate. For example, FIG. 10D illustrates memory cells 32 formed according to the method described above with respect to FIGS. 4A to 4C, followed by the formation of a conductive strip of material 64 formed in electrical contact with the memory cell upper electrodes 30 for each row of memory cells. Source regions 54 correspond to the array's word lines WL, and the conductive strip 64 corresponds to one of the array's bit lines BL. Each poly spacer 58 and corresponding channel region 60 form a field effect transistor that corresponds to one of the switches $SW_4$. Placing a positive voltage on spacer 58 turns on the channel region 60 making it conductive, which corresponds to turning switch $SW_4$ on (and allowing current to flow from source region 54, through channel region 60 and through the memory cell 32). Conversely, removing the positive voltage from spacer 58 turns off the channel region 60 making it non-conductive, which corresponds to turning switch $SW_4$ off.

Figure 11A:
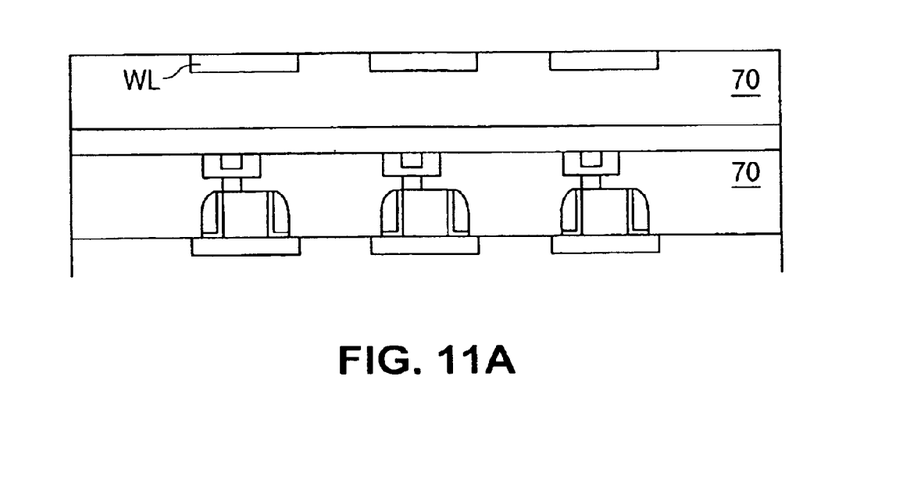
FIGS. 11A to 11C are cross-sectional views illustrating the process of forming memory cells of the alternate embodiment of the phase change memory cell array of the present invention.
Figure 11B:
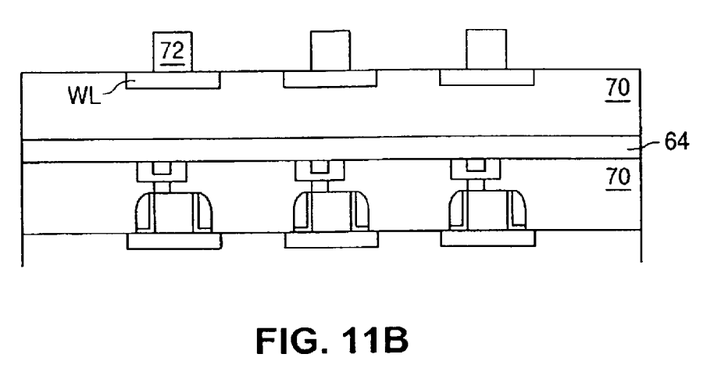
Figure 11C:
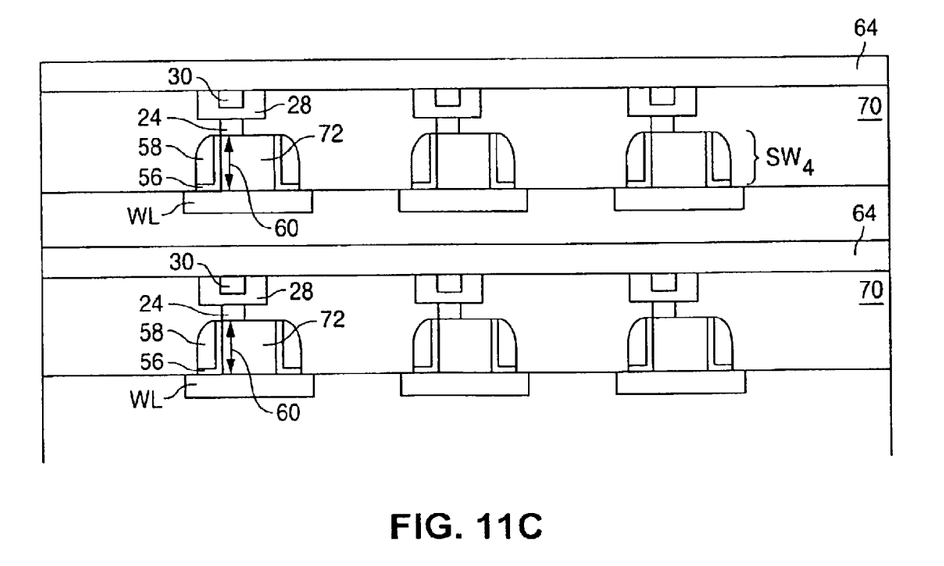

FIGS. 11A to 11C illustrate the formation of multiple levels of stacked memory cells 32, each memory cell with its own on/off switch $SW_4$. While only two levels of memory cells are shown, additional memory cell levels can be formed. The formation of one of the levels of the memory cells (e.g. the second level) begins by etching trenches in insulation material 70 (using a standard lithographic etch), and filling the trenches with conductive material (e.g. via deposition and CMP etch) to form the conductive word lines WL, as illustrated in FIG. 11A. Blocks of non-single crystalline silicon 72 (i.e. polysilicon, amorphous silicon, etc.) are then formed over the word lines WL using a silicon formation and lithographic etch process, as illustrated in FIG. 11B. The formation of the memory cell level is then completed by performing the steps described above with respect to FIGS. 10B to 10D, resulting in the structure illustrated in FIG. 11C. The channel regions 60 of silicon blocks 72 together with poly spacers 58 form the on/off switches $SW_4$. By stacking the memory cells in this manner, the size of the memory array formed thereby can be reduced.

It is to be understood that the present invention is not limited to the embodiment(s) described above and illustrated herein, but encompasses any and all variations falling within the scope of the appended claims. For example, voltage sense amplifier 44 could be a single voltage measuring component or separate voltage measuring components. Furthermore the exact location of the switches need not be placed exactly as shown (e.g. switches $SW_2$ could be located between resistor $R_1$ and the ground plane, switches $SW_3$ could be located between reference memory cell and the current source 40, and switches $SW_4$ could be located between the memory cells 32 and the bit line BL.

What is claimed is:

1. An array of phase change memory cells, comprising:
   a current source for supplying a read electrical current;
   a voltage sensor;
   a plurality of conductive bit lines each electrically connected to the current source via a first on/off switch;
   a plurality of conductive word lines each electrically connected to a voltage source via a second on/off switch and a first resistor, and to the voltage sensor;
   a plurality of memory cells, each including:
      a first electrode directly electrically connected to one of the bit lines,
      a second electrode directly electrically connected to one of the word lines, and
      phase change memory material disposed in electrical contact with the first and second electrodes; and
   a reference voltage source connected to the voltage sensor.

2. The array of claim 1, wherein the reference voltage source comprises:
   a reference memory cell that includes:
      a third electrode electrically connected to the current source,
      a fourth electrode electrically connected to the voltage source via a second resistor and to the voltage sensor, and
      phase change memory material disposed in electrical contact with the third and fourth electrodes; and
   a third on/off switch included in the electrical connection between the third electrode and the current source or the electrical connection between the fourth electrode and the second resistor.

3. The array of claim 1, wherein the reference voltage source comprises:
   a plurality of reference memory cells, each including:
      a third electrode electrically connected to the current source,
      a fourth electrode electrically connected to the voltage source via a second resistor and to the voltage sensor,
      phase change memory material disposed in electrical contact with the third and fourth electrodes, and
      a third on/off switch included in the electrical connection between the third electrode and the current source or the electrical connection between the fourth electrode and the second resistor.

4. The array of claim 3, wherein a resistivity of the phase change memory material of one of the plurality of reference memory cells is different from that of another one of the plurality of reference memory cells.

5. The array of claim 1, wherein the current source further selectively supplies a programming electrical current that is greater than the read electrical current, and is sufficient in amplitude and duration to alter a resistivity of the phase change material of the memory cells when the programming electrical current flows therethrough.

6. The array of claim 5, wherein for each of the memory cells, one of the first and second electrodes has a resistivity that is higher than that of the other of the first and second electrodes so that the programming electrical current flowing therethrough generates heat therein to heat the phase change memory material.

7. The array of claim 5, wherein each of the memory cells further comprises:
   insulation material having a hole formed therein;
   spacer material disposed in the hole and having a surface that defines an opening having a width that narrows along a depth of the opening, wherein the memory material is disposed in the opening and extends along the spacer material surface, and wherein one of the first and second electrodes is disposed in the opening and on the volume of memory material;
   wherein the one of the first and second electrodes and the volume of memory material form an electrical current path that narrows in width as the current path approaches the other of the first and second electrodes, so that the programming electrical current passing through the current path generates heat for heating the memory material.

8. The array of claim 7, wherein for each of the memory cells, an indentation is formed into the other of the first and second electrodes, and a portion of the memory material extends into the indentation.

9. The array of claim 7, wherein for each of the memory cells, the phase change memory material layer merges together to form a column of the phase change memory material disposed directly over the other of the first and second electrodes such that the current path reaches a minimum cross sectional area at the column.

10. An array of phase change memory cells, comprising:
    a current source for supplying a read electrical current;
    a voltage sensor;
    a plurality of conductive bit lines each electrically connected to the current source;
    a plurality of conductive word lines each electrically connected to a voltage source via a first resistor, and to the voltage sensor;
    a plurality of memory cells, each including:
       a first electrode directly electrically connected to one of the bit lines,
       a second electrode directly electrically connected to one of the word lines,
       phase change memory material disposed in electrical contact with the first and second electrodes, and
       a first on/off switch included in the direct electrical connection between the first electrode and the one bit line or the direct electrical connection between the second electrode and the one word line; and
    a reference voltage source connected to the voltage sensor.

11. The array of claim 10, wherein the reference voltage source comprises:
    a reference memory cell that includes:
       a third electrode electrically connected to the current source,
       a fourth electrode electrically connected to the voltage source via a second resistor and to the voltage sensor, and
       phase change memory material disposed in electrical contact with the third and fourth electrodes; and
    a second on/off switch included in the electrical connection between the third electrode and the current source or the electrical connection between the fourth electrode and the second resistor.

12. The array of claim 10, wherein the reference voltage source comprises:
    a plurality of reference memory cells, each including:
       a third electrode electrically connected to the current source,
       a fourth electrode electrically connected to the voltage source via a second resistor and to the voltage sensor, and
       phase change memory material disposed in electrical contact with the third and fourth electrodes, and
       a second on/off switch included in the electrical connection between the third electrode and the current source or the electrical connection between the fourth electrode and the second resistor.

13. The array of claim 12, wherein a resistivity of the phase change memory material of one of the plurality of reference memory cells is different from that of another one of the plurality of reference memory cells.

14. The array of claim 10, wherein the current source further selectively supplies a programming electrical current that is greater than the read electrical current, and is sufficient in amplitude and duration to alter a resistivity of the phase change material of the memory cells when the programming electrical current flows therethrough.

15. The array of claim 14, wherein for each of the memory cells, one of the first and second electrodes has a resistivity that is higher than that of the other of the first and second electrodes so that the programming electrical current flowing therethrough generates heat therein to heat the phase change memory material.

16. The array of claim 14, wherein each of the memory cells further comprises:

insulation material having a hole formed therein;

spacer material disposed in the hole and having a surface that defines an opening having a width that narrows along a depth of the opening, wherein the memory material is disposed in the opening and extends along the spacer material surface, and wherein one of the first and second electrodes is disposed in the opening and on the volume of memory material;

wherein the one of the first and second electrodes and the volume of memory material form an electrical current path that narrows in width as the current path approaches the other of the first and second electrodes, so that the programming electrical current passing through the current path generates heat for heating the memory material.

17. The array of claim 16, wherein for each of the memory cells, an indentation is formed into the other of the first and second electrodes, and a portion of the memory material extends into the indentation.

18. The array of claim 16, wherein for each of the memory cells, the phase change memory material layer merges together to form a column of the phase change memory material disposed directly over the other of the first and second electrodes such that the current path reaches a minimum cross sectional area at the column.

19. A method of operating a memory cell array having a current source for supplying electrical current, a voltage sensor, a plurality of conductive bit lines each electrically connected to the current source via a first on/off switch, a plurality of conductive word lines each electrically connected to a voltage source via a second on/off switch and a first resistor and to the voltage sensor, a reference voltage source, and a plurality of memory cells, wherein each of the memory cells includes a first electrode directly electrically connected to one of the bit lines, a second electrode directly electrically connected to one of the word lines, and a phase change memory material disposed in electrical contact with the first and second electrodes, the method comprising:

selecting one of the memory cells by turning on the first and second on/off switches for the bit and word lines directly electrically connected thereto;

supplying a read electrical current from the current source to the bit line directly electrically connected to the selected memory cell, wherein the read electrical current flows through the selected memory cell and produces a first voltage on the word line directly electrically connected thereto;

supplying a reference voltage from the reference voltage source; and measuring and comparing the first voltage and the reference voltage using the voltage sensor.

20. The method of claim 19, wherein the reference voltage source includes a reference memory cell that has a third electrode electrically connected to the current source, a fourth electrode electrically connected to the voltage source via a second resistor and to the voltage sensor, and phase change memory material disposed in electrical contact with the third and fourth electrodes, wherein a third on/off switch is included in the electrical connection between the third electrode and the current source or in the electrical connection between the fourth electrode and the second resistor, the method further comprising:

turning the third switch on; and supplying an electrical current from the current source to the reference memory cell, wherein the electrical current flows through the reference memory cell to produce the reference voltage on the fourth electrode.

21. The method of claim 19, wherein the reference voltage source includes a plurality of reference memory cells each having a third electrode electrically connected to the current source, a fourth electrode electrically connected to the voltage source via a second resistor and to the voltage sensor, phase change memory material disposed in electrical contact with the third and fourth electrodes, and a third on/off switch included in the electrical connection between the third electrode and the current source or in the electrical connection between the fourth electrode and the second resistor, the method further comprising:

selecting one of the reference memory cells by turning on the third on/off switch electrically connected to the selected reference memory cell;

supplying an electrical current from the current source to the selected reference memory cell, wherein the electrical current flows through the selected reference memory cell to produce the reference voltage on the fourth electrode of the selected reference memory cell.

22. The method of claim 19, further comprising:

supplying a programming electrical current that is greater than the read electrical current from the current source to the bit line directly electrically connected to the selected memory cell, wherein the programming electrical current flows through the selected memory cell with an amplitude and duration sufficient to heat the phase change material of the selected memory cell and alter a resistivity thereof.

23. A method of operating a memory cell array having a current source for supplying electrical current, a voltage sensor, a plurality of conductive bit lines each electrically connected to the current source, a plurality of conductive word lines each electrically connected to a voltage source via a first resistor and to the voltage sensor, a reference voltage source, and a plurality of memory cells, wherein each of the memory cells includes a first electrode directly electrically connected to one of the bit lines, a second electrode directly electrically connected to one of the word lines, a phase change memory material disposed in electrical contact with the first and second electrodes, and a first on/off switch included in the direct electrical connection between the first electrode and the one bit line or the direct electrical connection between the second electrode and the one word line, the method comprising:

selecting one of the memory cells by turning on the first on/off switch for the selected memory cell;

supplying a read electrical current from the current source to the bit line directly electrically connected to the selected memory cell, wherein the read electrical current flows through the selected memory cell and produces a first voltage on the word line directly electrically connected thereto;

supplying a reference voltage from the reference voltage source; and measuring and comparing the first voltage and the reference voltage using the voltage sensor.

24. The method of claim 23, wherein the reference voltage source includes a reference memory cell that has a third electrode electrically connected to the current source, a fourth electrode electrically connected to the voltage source via a second resistor and to the voltage sensor, and phase change memory material disposed in electrical contact with the third and fourth electrodes, wherein a second on/off switch is included in the electrical connection between the third electrode and the current source or in the electrical connection between the fourth electrode and the second resistor, the method further comprising:

turning the second switch on; and supplying an electrical current from the current source to the reference memory cell, wherein the electrical current flows through the reference memory cell to produce the reference voltage on the fourth electrode.

25. The method of claim 23, wherein the reference voltage source includes a plurality of reference memory cells each having a third electrode electrically connected to the current source, a fourth electrode electrically connected to the voltage source via a second resistor and to the voltage sensor, phase change memory material disposed in electrical contact with the third and fourth electrodes, and a second on/off switch included in the electrical connection between the third electrode and the current source or in the electrical connection between the fourth electrode and the second resistor, the method further comprising:

selecting one of the reference memory cells by turning on the second on/off switch electrically connected to the selected reference memory cell;

supplying an electrical current from the current source to the selected reference memory cell, wherein the electrical current flows through the selected reference memory cell to produce the reference voltage on the fourth electrode.

26. The method of claim 23, further comprising:

supplying a programming electrical current that is greater than the read electrical current from the current source to the bit line directly electrically connected to the selected memory cell, wherein the programming electrical current flows through the selected memory cell with an amplitude and duration sufficient to heat the phase change material of the selected memory cell and alter a resistivity thereof.

* * * * *